(12) United States Patent
Rickes et al.

(10) Patent No.: US 6,657,881 B1
(45) Date of Patent: Dec. 2, 2003

(54) RECONFIGURING STORAGE MODES IN A MEMORY

(75) Inventors: Jurgen Thomas Rickes, Cupertino, CA (US); Ralph Hurley Raymer Lanham, Cupertino, CA (US)

(73) Assignees: Agilent Technologies, Inc., Palo Alto, CA (US); Texas Instruments, Inc., Dallas, TX (US)

( * ) Notice: Subject to any disclaimer, the term of this patent is extended or adjusted under 35 U.S.C. 154(b) by 0 days.

(21) Appl. No.: 10/150,743

(22) Filed: May 17, 2002

(51) Int. Cl.[7] ............................ G11C 11/22; G11C 7/00
(52) U.S. Cl. .................................. 365/145; 365/189.04
(58) Field of Search ........................ 365/145, 65, 117, 365/149, 102, 189.04, 189.09, 202, 230.05

(56) References Cited

U.S. PATENT DOCUMENTS 6,038,162 A * 3/2000 Takata et al. ............... 365/145
6,249,841 B1 * 6/2001 Sikes et al. .................. 365/63
6,310,797 B1 * 10/2001 Muneno ..................... 365/145
6,496,428 B2 * 12/2002 Ohno et al. ................. 365/200

* cited by examiner

Primary Examiner—Thong Q. Le

(57) ABSTRACT

A memory which is capable of reconfiguration between a first mode in which each storage cell is capable of storing a pair of data bits and a second mode in which each storage cell is capable of storing a single data. A memory according to the present teachings includes a storage cell having a first structure and a second structure each capable of a storage state and mechanisms for reconfiguring the memory between a first mode in which the storage states of the first and second structures indicate a first and a second data bit, respectively, and a second mode in which the storage states combine to indicate a data bit.

20 Claims, 3 Drawing Sheets

RECONFIGURING STORAGE MODES IN A MEMORY

BACKGROUND OF THE INVENTION

1. Field of Invention

The present invention pertains to the field of random access memories. More particularly, this invention relates to storage modes in a memory.

2. Art Background

A random access memory typically includes an array of storage cells. Each storage cell typically includes structures capable of changing storage states. For example, ferroelectric random access memories (FeRAMs) typically include ferroelectric capacitors capable of changing charge polarities. In another example, magnetic random access memories (MRAMs) commonly include magnetic films capable of changing magnetizations. The storage states of a storage cell usually indicate its logic state, i.e. a value of a bit that it stores.

Some memories implement a storage cell having a single storage structure capable of changing storage states. For example, a storage cell in a ferroelectric random access memory (FeRAM) may include a single ferroelectric capacitor capable of changing its charge polarity and a single transistor for accessing the stored state. Such a structure may be referred to as a one-transistor-one-capacitor (1T1C) cell structure. Similarly, an MRAM storage cell may be implemented with a single magnetic film structure capable of changing its magnetization.

A storage cell having a single storage structure is usually read by sensing its storage state and comparing the obtained signal to a reference. Typically, the reference is common for all the storage cells in a memory. If a signal sensed from a storage cell is greater than the reference then the storage cell is usually deemed to be in a first logic state and if the sensed signal is less than the reference then the storage cell is usually deemed to be in a second logic state.

The characteristics of the storage states in the storage cells of a memory typically vary due to variation in a manufacturing process as well as material fatigue over time and other factors. A relatively high variation in storage state characteristics usually increases the difficulty in selecting a reference which is suitable for reading all of the storage cells in a memory. If the variation among storage cells in a memory is large enough then a suitable reference may not be obtainable. Unfortunately, in such cases and the memory is usually discarded. Such discarding of individual memories usually decreases the yield of a manufacturing process and increases overall manufacturing costs.

Other memories implement a storage cell having dual storage structures each capable of changing storage states. For example, a storage cell in an FeRAM may include a pair of ferroelectric capacitors each capable of changing its charge polarity and a pair of corresponding transistors for accessing the stored states. Such a structure may be referred to as a two-transistor-two-capacitor (2T2C) cell structure. Similarly, an MRAM storage cell may be implemented with dual magnetic film structures each capable of changing its magnetization.

A storage cell having dual storage structures is usually read by sensing both its storage states and performing a differential comparison on the sensed signals. Such memories are usually less susceptible to the problems caused by manufacturing variation and material fatigue etc., because such variation tend to influence the storage structures in a complementary fashion. Such storage cells however, limit the amount of data storage density in a memory due to the additional storage structures.

SUMMARY OF THE INVENTION

A memory is disclosed which is capable of reconfiguration between a first mode in which each storage cell is capable of storing a pair of data bits and a second mode in which each storage cell is capable of storing a single data. A memory according to the present teachings includes a storage cell having a first structure and a second structure each capable of a storage state and mechanisms for reconfiguring the memory between a first mode in which the storage states of the first and second structures indicate a first and a second data bit, respectively, and a second mode in which the storage states combine to indicate a data bit. The present techniques enable reconfiguration of the memory at the time of manufacture or at a later time in response to measured characteristics of the storage cells.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
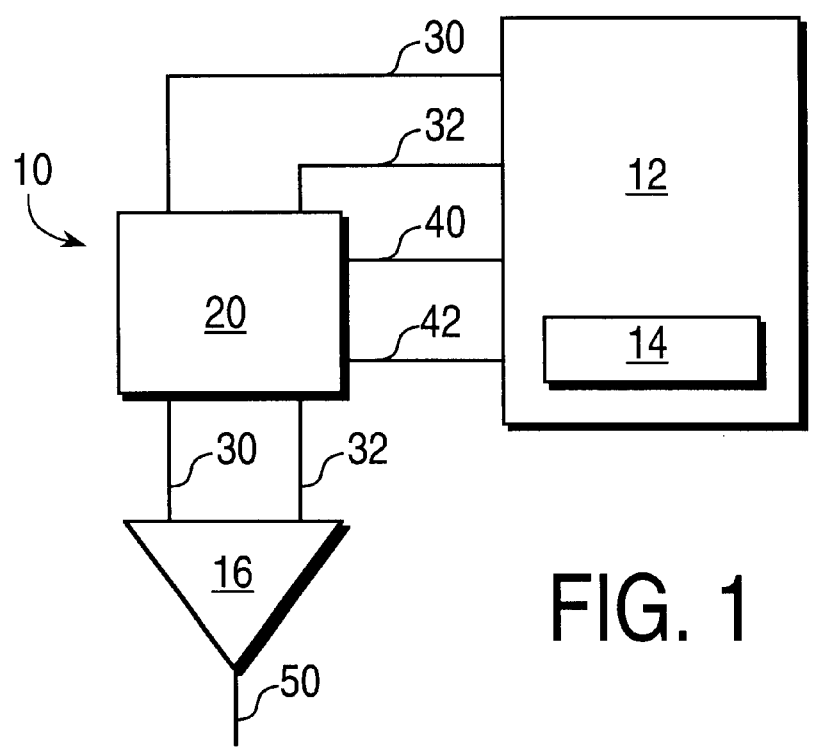
FIG. 1 shows a memory according to the present teachings.

FIG. 1 shows a memory 10 according to the present teachings. The memory 10 is shown having a storage cell 20 coupled to a set of bit lines 30–32 and a set of word lines 40–42. The bit lines 30–32 are coupled to a sense amplifier 16 which provides an indication 50 of the logic state of the storage cell 10 during a read operation.

A memory according to the present teachings may include any number of storage cells, for an example an array, with appropriate arrangement of additional bit lines and word lines, etc.

The storage cell 20 includes a pair of storage structures each capable of changing storage states. The storage cell 20 is capable of operating in a first mode in which the respective storage states of its two storage structures indicate a first and a second data bit. The storage cell 20 is further capable of operating in a second mode in which the storage states of its two storage structures combine to indicate a data bit. The operating mode of the storage cell 20 is controlled by an access circuit 12.

The access circuit 12 in this embodiment includes a non-volatile memory 14 that stores an indication of the operating mode. The non-volatile memory 14 may hold a single indication of the operating mode of all the storage cells in the memory 10 or different indications of operating mode for different storage cells or groups of storage cells. The contents of the non-volatile memory 14 may be programmed during manufacture of the memory 10 or at a later time. The contents of the non-volatile memory 14 may be programmed and/or reprogrammed by an external processor (not shown).

In one embodiment, the non-volatile memory 14 is a set of FeRAM storage cells. In other embodiments, other types of non-volatile storage mechanisms may be used.

In the first mode of operation, the access circuit 12 reads the contents of one half of the storage cell 20, i.e. the state of its first storage structure, by applying a voltage $V_{DD}$ to the word line 40 and by applying a voltage $V_0$ to the word line 42 and by applying a reference voltage $V_{REF}$ to the bit line 32. The voltage $V_{DD}$ on the word line 40 causes a charge to be read out of the first storage structure in the storage cell 20 onto the bit line 30. The voltage $V_0$ one the word line 42 prevents charge from being read out of the second storage structure in the storage cell 20 onto the bit line 32. The reference voltage $V_{REF}$ instead drives the bit line 32. The sense amplifier 16 compares the voltage read out onto the bit line 30 to the reference voltage $V_{REF}$ carried on the bit line 32, thereby yielding the indication 50 of the logic state of one half of the storage cell 20. The contents of the other half of the storage cell 20, i.e. the state of its second storage structure, may be read in a similar manner by reversing the activity on the word lines 40 and 42.

In the second mode of operation, the access circuit 12 reads the storage cell 20 by applying the voltage $V_{DD}$ to the word lines 40 and 42 and by not driving the bit line 32. The voltage $V_{DD}$ on the word line 40 causes a charge to be read out of the first storage structure in the storage cell 20 onto the bit line 30. The voltage $V_{DD}$ one the word line 42 causes a charge to be read out of the second storage structure in the storage cell 20 onto the bit line 32. The sense amplifier 16 compares the voltage read out onto the bit line 30 to the voltage read out onto the bit line 32, thereby yielding the indication 50 of the logic state of the storage cell 20.

In one embodiment, the voltage $V_{DD}$ is a supply voltage for the memory 10 and the voltage $V_0$ is zero volts.

Figure 2A:
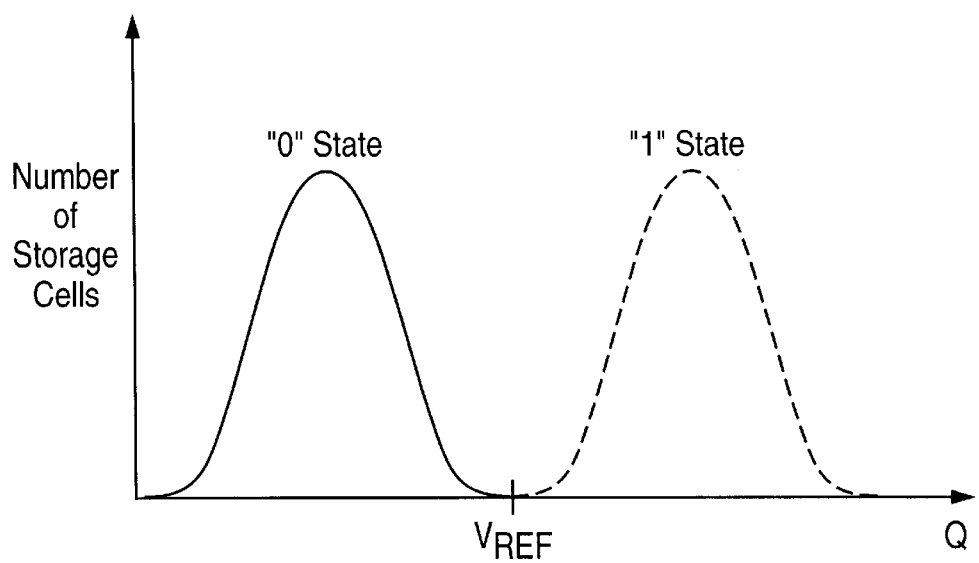
FIGS. 2a–2b show example charge distributions for a memory.

FIG. 2a shows a charge distribution obtained for an embodiment of the memory 10 which includes a relatively large number of storage cells. The charge distribution shows the number of storage cells verses stored charge in the storage structures of a storage cell. The left portion of the distribution may be deemed as charge levels corresponding to a "0" logic state of a storage cell and the right portion of the distribution may be deemed as charge levels corresponding to a "1" logic state of a storage cell.

A memory having the charge distribution shown in FIG. 2a is well suited for operation in the first mode because a level for $V_{REF}$ may be determined that will clearly distinguish the storage state of all of its memory cells during read operations.

Figure 2B:
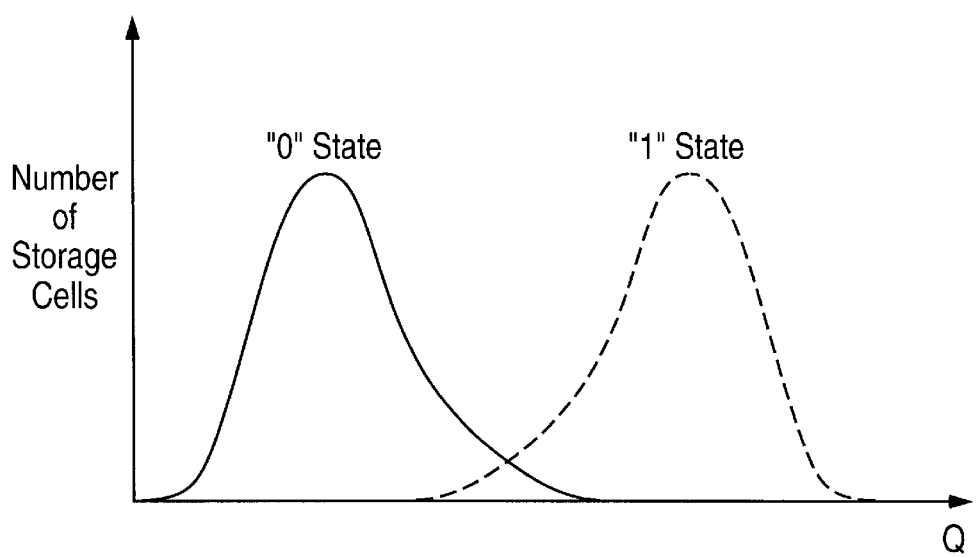

FIG. 2b shows another example of a charge distribution. A memory having this charge distribution is better suited for operation in the second mode because of the difficulty in determining a level for $V_{REF}$ that will clearly distinguish the storage state of all of its memory cells during read operations. Any level for $V_{REF}$ chosen will likely lead to failures particularly with time as individual cells age and charge characteristics drift.

The memory 10 may undergo tests that determine its charge distribution at the time of its manufacture or at a later time such as during a repair. The charge distribution is analyzed to determine whether the memory 10 should be operated in the first mode or in the second mode. The non-volatile memory 14 may then be programmed or reprogrammed accordingly.

Figure 3:
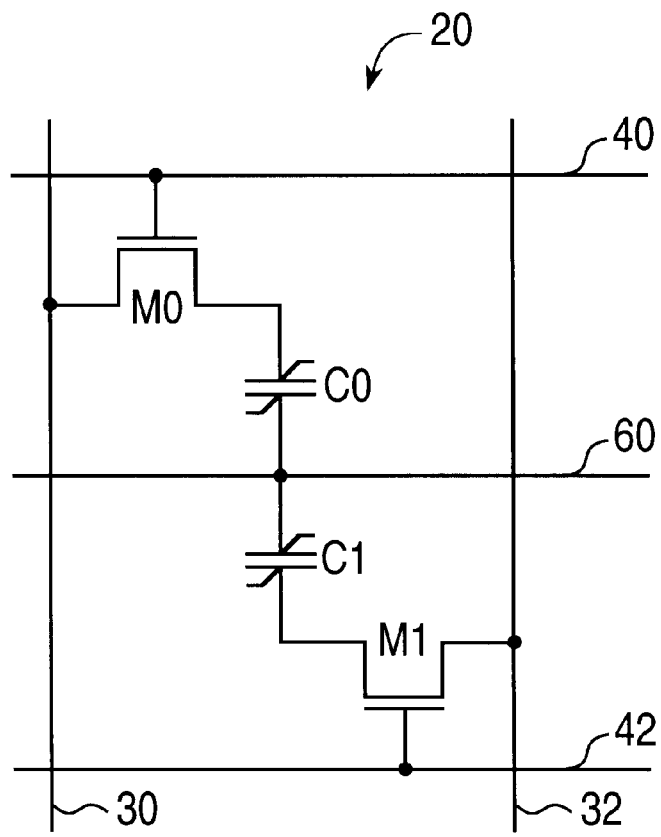
FIG. 3 shows one embodiment of a storage cell which include a pair of ferroelectric capacitors as charge storage structures.

FIG. 3 shows one embodiment of the storage cell 20 which include a pair of ferroelectric capacitors C0 and C1 as storage structures. The memory 10 in this embodiment is a ferroelectric random access memory (FeRAM). The FeRAM storage cell 20 may be viewed as being re-programmable between 1T1C and 2T2C configurations. The present teachings are nevertheless applicable to other types of memories that employ other types of storage structures such as MRAMs.

The ferroelectric capacitor C0 enables storage of a charge polarity in the first mode of operation and the ferroelectric capacitor C1 enables storage of a complementary charge polarity in the second mode of operation. The storage cell 20 includes an access transistor M0 for transferring charge from the ferroelectric capacitor C0 to the bit line 30 and an access transistor M1 for transferring charge from the ferroelectric capacitor C1 to the bit line 32.

The ferroelectric capacitors C0 and C1 are coupled to a plate line 60 which is driven by the access circuit 12 and charges are written into the ferroelectric capacitors C0 and C1 in a known manner.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A memory, comprising:
   storage cell having a structure that is capable of storing two data bits;
   means for reconfiguring the memory between a first mode in which the storage cell stores two data bits and a second mode in which the storage cell stores only one data bit.

2. The memory of claim 1, wherein the structure includes a pair of capacitors each capable of a corresponding storage state.

3. The memory of claim 2, wherein in the first mode the storage state of the first capacitor indicates a first data bit and the storage state of the second capacitor indicates a second data bit.

4. The memory of claim 2, wherein in the second mode the storage states combine to indicate a data bit.

5. The memory of claim 2, wherein each capacitor is a ferroelectric capacitor.

6. The memory of claim 1, further comprising means for storing an indication of the first or the second mode.

7. The memory of claim 6, wherein the means for storing an indication comprises a non-volatile memory.

8. The memory of claim 6, wherein the non-volatile memory comprises a set of ferroelectric storage cells.

9. The memory of claim 2, further comprising a sense amplifier for determining the storage states.

10. The memory of claim 9, wherein the means for reconfiguring includes an access circuit coupled to a pair of bit lines and a pair of word lines of the storage cell.

11. The memory of claim 10, wherein the access circuit reads the storage cell in the first mode by applying a set of voltages to the bit and word lines such that the sense amplifier compares the storage state of the first capacitor to a reference.

12. The memory of claim 10, wherein the access circuit reads the storage cell in the second mode by applying a set of voltages to the bit and word lines such that the sense amplifier compares the storage states of the first and second capacitors.

13. A method for reconfiguring a storage mode of a memory, comprising the steps of:
   determining whether a reference for reading a set of storage cells in the memory is obtainable;

if the reference is obtainable, then programming the memory into a first mode in which each storage cell is capable of storing a pair of data bits;

if the reference is not obtainable, then programming the memory into a second mode in which each storage cell is capable of storing a single data bit.

14. The method of claim 13, wherein the step of determining whether a reference is obtainable comprises the step of determining whether the reference is obtainable in response to a charge distribution for the memory.

15. The method of claim 13, wherein the steps of programming comprise the step of programming a set of non-volatile memory cells in the memory.

16. A storage cell having a structure that is capable of storing two data bits in a first mode and only one data bit in a second mode.

17. The storage cell of claim 16, wherein the structure includes a pair of capacitors each capable of a corresponding storage state.

18. The storage cell of claim 17, wherein in the first mode the storage state of the first capacitor indicates a first data bit and the storage state of the second capacitor indicates a second data bit.

19. The storage cell of claim 17, wherein in the second mode the storage states combine to indicate a data bit.

20. The storage cell of claim 17, wherein the each capacitor is a ferroelectric capacitor.

* * * * *